United States Patent
Loureiro et al.

(10) Patent No.: US 9,592,411 B2
(45) Date of Patent: *Mar. 14, 2017

(54) EXPLOSION PROOF BY CONTAINMENT ENCLOSURE FOR HOUSING ELECTRICAL EQUIPMENT

(71) Applicant: HAMILTON SUNDSTRAND CORPORATION, Windsor Locks, CT (US)

(72) Inventors: Melissa Loureiro, Pawtucket, RI (US); Thomas E. Powell, Collinsville, CT (US)

(73) Assignee: HAMILTON SUNDSTRAND CORPORATION, Windsor Locks, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/699,026

(22) Filed: Apr. 29, 2015

(65) Prior Publication Data

US 2015/0239632 A1    Aug. 27, 2015

Related U.S. Application Data

(63) Continuation of application No. 13/422,302, filed on Mar. 16, 2012, now Pat. No. 9,066,420.

(51) Int. Cl.
| | |
|---|---|
| *A62C 2/06* | (2006.01) |
| *A62C 3/16* | (2006.01) |
| *A62C 4/00* | (2006.01) |
| *H05K 5/02* | (2006.01) |
| *B65D 25/38* | (2006.01) |
| *B65D 43/22* | (2006.01) |

(Continued)

(52) U.S. Cl.
CPC .......... *A62C 4/00* (2013.01); *A62C 2/06* (2013.01); *A62C 3/16* (2013.01); *B65D 25/38* (2013.01); *B65D 43/22* (2013.01); *B65D 81/02* (2013.01); *B65D 85/70* (2013.01); *H05K 5/0213* (2013.01)

(58) Field of Classification Search
CPC .............. A62C 2/06; A62C 3/16; A62C 4/00
See application file for complete search history.

(56) References Cited

U.S. PATENT DOCUMENTS

| | | |
|---|---|---|
| 2,682,952 A | 7/1954 | Griffin |
| 2,835,772 A | 5/1958 | De Giovanni |
| 3,607,604 A | 9/1971 | Nava |

(Continued)

*Primary Examiner* — Ryan Reis
(74) *Attorney, Agent, or Firm* — Cantor Colburn LLP

(57) ABSTRACT

A low profile explosion proof by containment enclosure includes a base wall having first and second edge sections that are joined with third and fourth edge sections to define a substantially planar surface. First and second side walls extend from the first and second edge sections, and third and fourth side walls extending from the third and fourth edge sections and are joined with the first and second side walls. The base wall, first and second, and third and fourth side walls define an interior zone. A cover is coupled to the first and second, and third and fourth side walls to enclose the interior zone and provide containment to any flammable events. At least one of the first and second side walls, third and fourth side walls, base wall, and cover includes one or more unobstructed openings that provide fluid drainage while also providing containment to any flammable events.

15 Claims, 3 Drawing Sheets

(51) Int. Cl.
*B65D 81/02* (2006.01)
*B65D 85/00* (2006.01)

(56) References Cited

U.S. PATENT DOCUMENTS

| | | | |
|---|---|---|---|
| 4,467,136 A | 8/1984 | Wium | |
| 4,620,061 A * | 10/1986 | Appleton | H02G 3/14 174/51 |
| 4,664,281 A * | 5/1987 | Falk | H02G 3/088 174/50 |
| 5,534,664 A * | 7/1996 | Fearing, Jr. | F21V 19/04 174/50 |
| 5,661,265 A | 8/1997 | Yarbrough et al. | |
| 6,040,526 A * | 3/2000 | Olzak | H05K 5/0213 174/17 LF |
| 6,279,768 B1 * | 8/2001 | Mendoza | H02G 3/12 220/3.8 |
| 6,953,890 B2 * | 10/2005 | Koessler | H02G 3/081 174/50 |
| 7,432,439 B2 * | 10/2008 | Takada | H01R 9/2425 174/50 |
| 8,328,045 B2 * | 12/2012 | Naumann | H02G 3/14 220/3.7 |
| 2007/0095554 A1 * | 5/2007 | Noda | H01H 9/042 174/55 |
| 2009/0071712 A1 | 3/2009 | Kim | |
| 2009/0084896 A1 | 4/2009 | Boucher et al. | |
| 2010/0284150 A1 | 11/2010 | Manahan et al. | |

* cited by examiner

EXPLOSION PROOF BY CONTAINMENT ENCLOSURE FOR HOUSING ELECTRICAL EQUIPMENT

CROSS-REFERENCE TO RELATED APPLICATION

This application is a continuation of U.S. application Ser. No. 13/422,302 filed Mar. 16, 2012, the disclosure of which is incorporated by reference herein in its entirety.

BACKGROUND OF THE INVENTION

Exemplary embodiments pertain to the art of enclosures and, more particularly, to an explosion proof enclosure for housing electrical equipment.

Electrical housings or enclosures provide protection for electrical controllers, circuit boards, and the like. Often times, the enclosure and the electrical equipment are subjected to harsh operating environments. Environmental elements such as wind, rain, humidity, dirt, and the like may all cause damage to electrical components. In addition to exposure to environmental elements, electrical equipment is often times mounted in areas that are exposed to various flammable liquids and/or gases that could be ignited if contacted by a spark or flame. When placed in environments that are exposed to flammable liquids and/or gases, electrical enclosures typically should be explosion proof by either containment, ventilation or through a hermetic seal. In other words, any flame that may be ignited within the enclosure should not be allowed to exit to external, surrounding areas.

BRIEF DESCRIPTION OF THE INVENTION

Disclosed is a low profile explosion proof by containment enclosure including a base wall having first and second opposing edge sections that are joined with third and fourth opposing edge sections to define a substantially planar surface. First and second opposing side walls extend from the first and second opposing edge sections, and third and fourth opposing side walls extending from the third and fourth opposing edge sections and are joined with the first and second opposing side walls. The base wall, first and second, and third and fourth opposing side walls define an interior zone. A cover is coupled to the first and second, and third and fourth opposing side walls. The cover is spaced from the base member so as to enclose the interior zone and provide containment to any internal flammable events. At least one of the first and second opposing side walls, third and fourth opposing side walls, base wall, and cover includes one or more unobstructed openings that provide fluid drainage while also providing containment to any internal flammable events.

Also disclosed is a method of relieving pressure in a low profile explosion by containment enclosure having first and second, and third and fourth opposing side walls and a cover. The method includes allowing air to pass through one or more unobstructed openings formed in one or more of the first and second, third and fourth opposing side walls, and cover. The openings are configured and disposed to prevent flames that may exist in an interior portion of the low profile explosion proof by containment enclosure from passing to an exterior of the low profile explosion proof by containment enclosure.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

A detailed description of one or more embodiments of the disclosed apparatus and method are presented herein by way of exemplification and not limitation with reference to the Figures.

Figure 1:
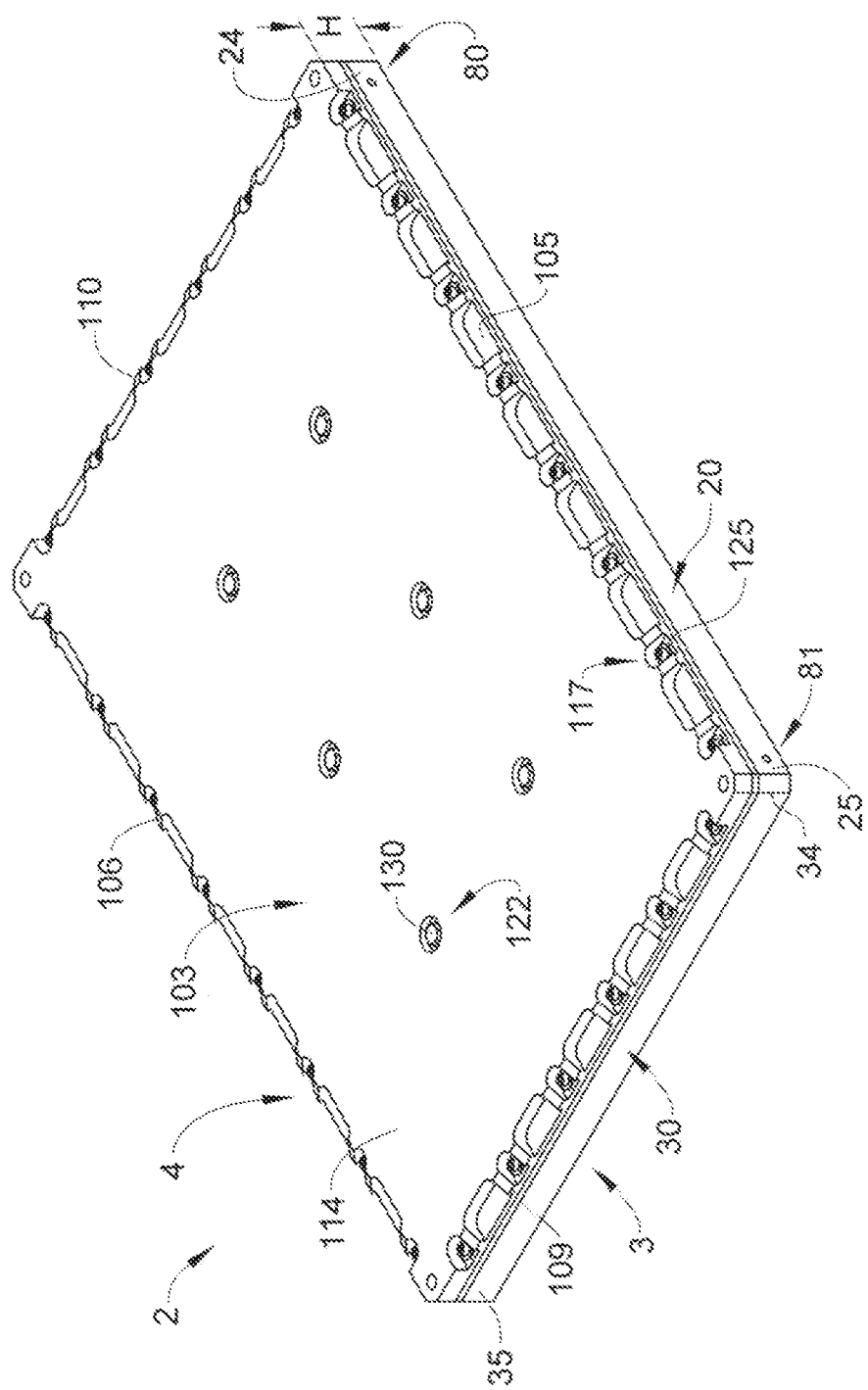
FIG. 1 is a perspective view of a low profile explosion proof by containment enclosure in accordance with an exemplary embodiment.
Figure 2:
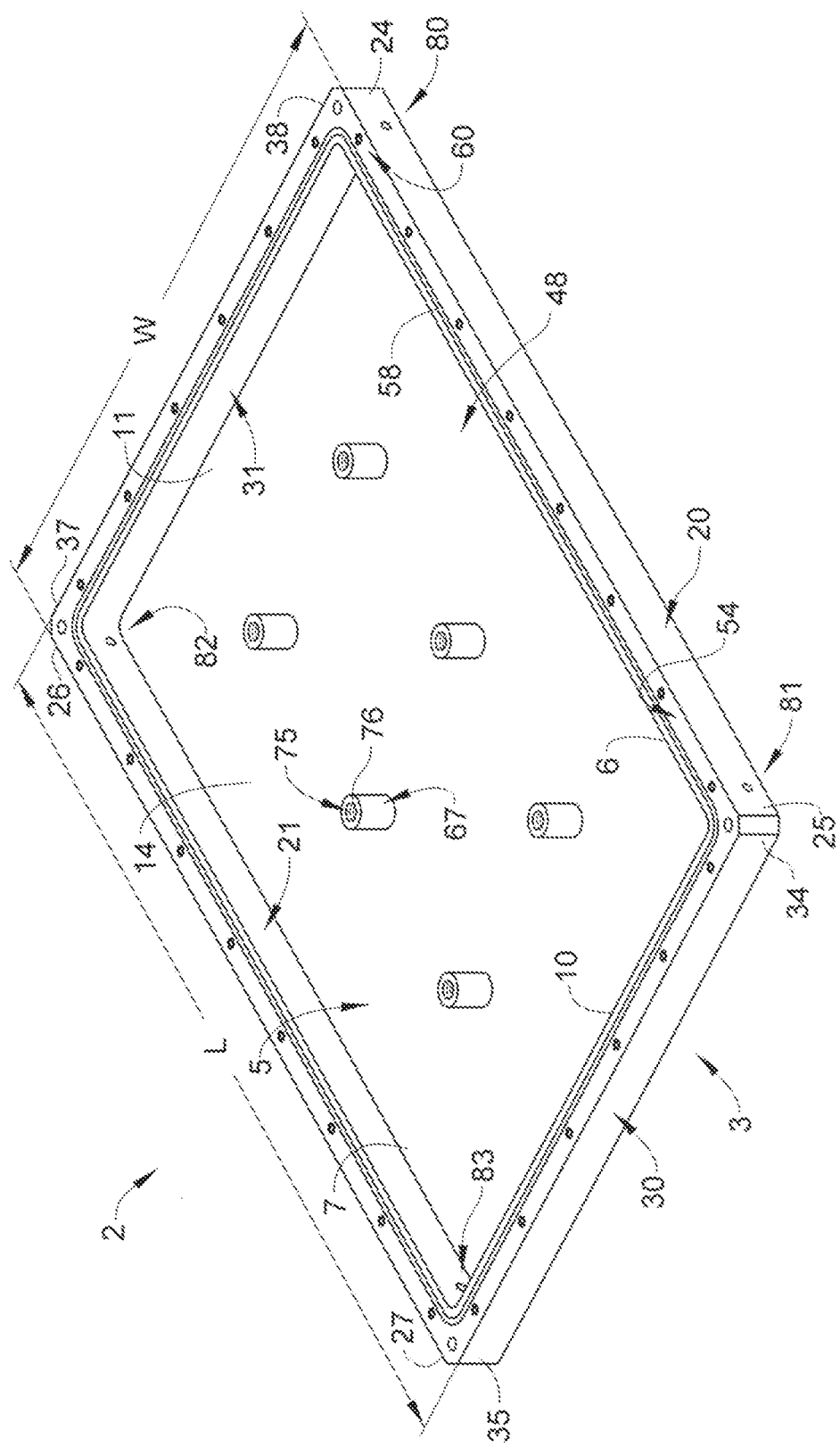
FIG. 2 is a perspective view of a portion of the low profile explosion proof by containment enclosure of FIG. 1.
Figure 3:
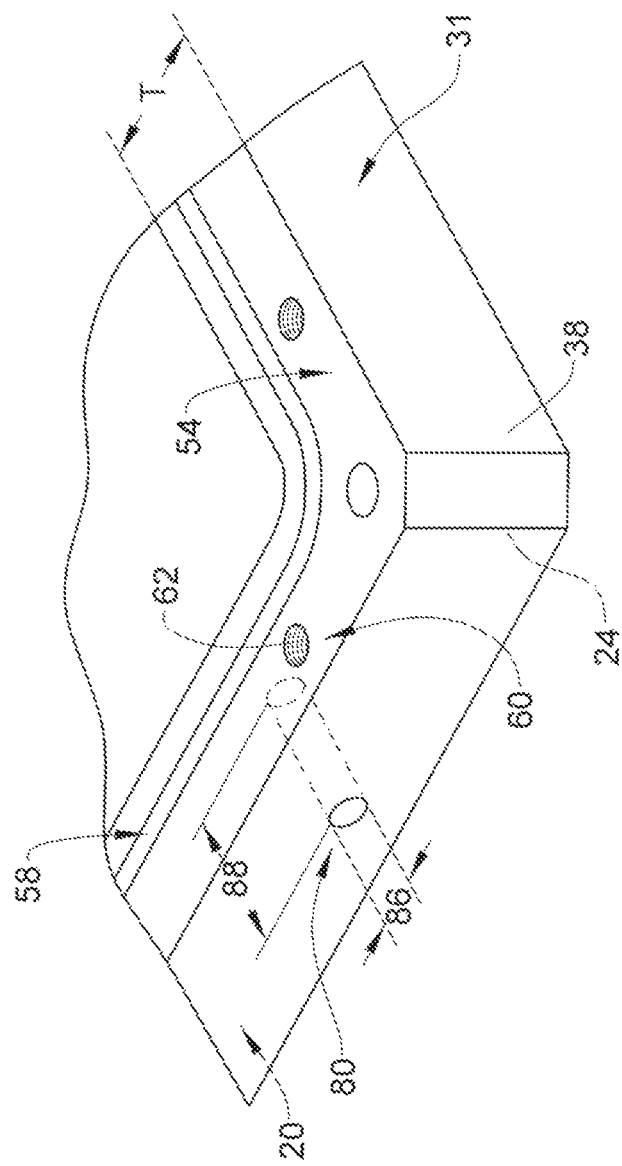
FIG. 3 is a partial perspective view of a portion of the low profile explosion proof by containment enclosure of FIG. 1.

Referring to FIGS. 1-3, a low profile explosion proof by containment enclosure in accordance with an exemplary embodiment is indicated generally at 2. Particularly shown in FIG. 2, low profile explosion proof by containment enclosure 2 includes a chassis 3 and a cover 4. Chassis 3 includes a base wall 5 having first and second opposing edge sections 6 and 7 that join with third and fourth opposing edge sections 10 and 11 to define a substantially planar surface 14. Low profile explosion proof by containment enclosure 2 is also shown to include first and second opposing side walls 20 and 21 that extend generally perpendicularly from respective ones of first and second opposing edge sections 6 and 7. First side wall 20 includes a first end 24 that extends to a second end 25. Similarly, second side wall 21 includes a first end 26 that extends to a second end 27. First and second side walls 20, 21 define a length (L) of low profile explosion proof by containment enclosure 2 that is defined between, for example, first and second ends 26 and 27 of second sidewall 21.

Low profile explosion proof by containment enclosure 2 is further shown to include third and fourth opposing side walls 30 and 31 that extends generally perpendicularly from respective ones of third and fourth edge sections 10 and 11. Third side wall 30 includes a first end 34 that extends to a second end 35. Similarly, fourth side wall 31 includes a first end 37 that extends to a second end 38. Third and fourth side walls 30, 31 define a width (W) of low profile explosion proof by containment enclosure 2 that is defined between, for example, first and second ends 37 and 38 of fourth sidewall 31. Low profile explosion proof by containment enclosure 2 also includes a height (H). At this point it should be understood that the term low profile defines a profile in which both the length (L) and width (W) are substantially greater than the height (H). In accordance with one aspect of the exemplary embodiment, the length (L) is about 15 times greater than height (H) and width (W) is about 10 times greater than height (H). Of course, it should be understood, that the dimensions may vary. Base wall 5, first and second opposing side wall 20, 21, and third and fourth opposing side walls 30, 31 collectively define an interior zone 48. Interior zone 48 may be configured to house various electronic components such as printed wiring boards (PWB), controllers, computers and the like.

In further accordance with the exemplary embodiment, low profile explosion proof by containment enclosure 2 includes a flange 54 that extends about outer edge portions (not separately labeled) of first and second opposing side walls 20, 21 and third and fourth opposing side walls 30, 31. By outer edge, it should be understood that flange 54 extends about an edge that is cantilevered from base wall 5. Flange 54 includes a thickness (T) that is configured and disposed to prevent any flames that may be present within interior zone 48 from passing to an exterior of low profile explosion proof by containment enclosure 2. That is, low profile explosion proof by containment enclosure 2 is configured to be arranged in an environment that is exposed to flammable liquid and/or gases. In the event that a spark or other ignition event occurs within interior zone 48 creating a flame, low profile explosion proof by containment enclosure 2 will prevent any flame from passing into the environment. In accordance with one aspect of the exemplary embodiment, flange 54 has a width (T) that is between about 0.667-inches (about 16.94-mm) and about 0.780-inches (about 19.81-mm). Flange 54 is also shown to include a receiving portion 58 that receives a seal (not shown) which prevents moisture from entering interior zone 48.

In accordance with another aspect of the exemplary embodiment, flange 54 includes a plurality of cover mounting elements, one of which is indicated at 60. Cover mounting elements 60 include threaded openings 62 (FIG. 3) that are configured to receive threaded mechanical fasteners (not separately labeled). In addition, low profile explosion proof by containment enclosure 2 includes a plurality of cover mounting fastener receiver members, one of which is indicated at 67, that project substantially perpendicularly from substantially planar surface 14. Each cover mounting fastener receiver member 67 includes a central passage 75 provided with a plurality of threads 76.

In accordance with yet another aspect of the exemplary embodiment, low profile explosion proof by containment enclosure 2 includes a plurality of unobstructed openings 80-83. By unobstructed, it should be understood that openings 80-83 are devoid of any flame arresting structure, plugs, or the like. Openings provide an unobstructed flow path from interior zone 48 to an exterior of low profile explosion proof by containment enclosure 2. Opening 80 is arranged near first end 24 of first side wall 20 and opening 81 is arranged near second end 25 of first side wall 20. Opening 82 is positioned adjacent first end 26 of second side wall 21 and opening 83 is positioned near second end 27 of second side wall 21. Additional openings (not shown) may also be provided in third and four opposing side walls 30 and 31.

As each unobstructed opening 80-83 is similarly formed, a detailed description will be made with reference to FIG. 3 in describing opening 80 with an understanding that openings 81-83 include similar dimensions. Opening 80 includes a diameter 86. In accordance with one aspect of the exemplary embodiment, diameter 86 is between about 0.040-inches (about 1.02-mm) and about 0.096-inches (about 2.44-mm). In accordance with another aspect of the exemplary embodiment, diameter 86 is about 0.060-inches. Each opening 86 also includes a length 88. In accordance with one aspect of the exemplary embodiment, length 88 is between about 0.125-inches (about 3.18 mm) and about 1.00-inches (about 25.4-mm). In accordance with another aspect of the exemplary embodiment, length 88 is about 0.815-inches. Diameter 86 and length 88 define an aspect ratio for each unobstructed opening 80-83. Unobstructed openings 80-83 are arranged to allow for fluid drainage when low profile explosion proof by containment enclosure 2 is arranged in various external environments and orientations.

In accordance with the exemplary embodiment, the aspect ratio for each unobstructed openings 80-83 allows fluid to pass from interior zone 48 to an exterior of low profile explosion proof by containment enclosure 2 while at the same time preventing any flame that may be present within interior zone 48 from passing to the exterior of low profile explosion proof by containment enclosure 2. In addition to allowing fluid to drain, unobstructed openings 80-83 provide pressure relief for low profile explosion proof by containment enclosure 2. More specifically, if mounted in an aircraft, low profile explosion proof by containment enclosure 2 is exposed to altitude changes that may create pressure fluctuations within interior zone 48. Unobstructed openings 80-83 allow air to flow through interior zone 48 to prevent pressure build up.

In accordance with still another aspect of the exemplary embodiment, low profile explosion proof by containment enclosure 2 includes a cover 4. Cover 4 includes a cover body 103 having first and second opposing edge portions 105 and 106 that join with third and fourth opposing edge portions 109 and 110 to form a generally planar surface 114. Cover 4 includes a first plurality of fastener openings 117 and a second plurality of fastener openings 122. First plurality of fastener openings 117 extend along first and second opposing edge portions 105 and 106 as well as third and fourth opposing edge sections 109 and 110. First plurality of fastener openings 117 are configured to register with cover mounting elements 60. In this manner, a plurality of mechanical fasteners, one of which is shown at 125 are passed through first plurality of cover mounting openings 117 and engaged with respective ones of cover mounting elements 60 to secure an outer periphery of cover 4 to flange 54. Second plurality of fastener openings 122 are arranged centrally on planar surface 114 and configured to register with corresponding ones of cover mounting fastener receiver members 67. Cover 4 and flange 54 combine to prevent any egress of flames that may be present within interior zone 48. Additional mechanical fasteners, one of which is indicated at 130, are employed to secure a central portion of cover 4 to base wall 5 through cover mounting fastener receiver members 67. With this arrangement, cover 4 is prevented from bowing/flexing which may result from pressure caused by an internal flame.

At this point, it should be understood that the exemplary embodiments provide a low profile explosion proof by containment enclosure that prevents any egress of flames within interior zone 48 while at the same time providing pressure relief and fluid drainage. Fluid drainage and pressure relief is provided by one or more unobstructed openings arranged on side walls of the low profile explosion proof by containment enclosure. The use of unobstructed openings allows for liquid and/or air to flow from the interior zone without being constrained such as by clogging that might otherwise occur if flame arrestors or other structure is used to prevent flame egress. It should be understood that while being described as having similar dimensions, the dimensions of the openings could vary. In addition to the opening, the particular width of the flange, combined with the cover, prevent flame egress without the need for complex flame extinguishing flow paths.

While the invention has been described with reference to an exemplary embodiment or embodiments, it will be understood by those skilled in the art, that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims.

What is claimed is:

1. A low profile explosion proof by containment enclosure comprising:
   a base wall having first and second opposing edge sections that are joined with third and fourth opposing edge sections to define a substantially planar surface;
   first and second opposing side walls extending from the first and second opposing edge sections;
   third and fourth opposing side walls extending from the third and fourth opposing edge sections and being joined with the first and second opposing side walls, the base wall, first and second, and third and fourth opposing side walls defining an interior zone; and
   a cover coupled to the first and second, and third and fourth opposing side walls, the cover being spaced from the base wall so as to enclose the interior zone and provide containment to any internal flammable events;
   wherein at least one of the first and second opposing side walls, third and fourth opposing side walls, base wall, and cover includes one or more unobstructed openings that provide fluid drainage while also providing containment to any internal flammable events;
   wherein the aspect ratio of the openings is such that all flame is prevented from passing from a region inside of the enclosure to and region outside of the enclosure.

2. The low profile explosion proof by containment enclosure according to claim 1, further comprising a flange extending about the first and second, and third and fourth opposing side walls.

3. The low profile explosion proof by containment enclosure according to claim 2, wherein the flange has a thickness between about 0.667-inches (about 16.94-mm) and about 0.780-inches (about 19.81-mm).

4. The low profile explosion proof by containment enclosure according to claim 2, further comprising:
   a plurality of mechanical fasteners extending through the cover and into the flange.

5. The low profile explosion proof by containment enclosure according to claim 1, wherein the one or more unobstructed opening includes at least two unobstructed openings in each of the first and second opposing side walls.

6. The low profile explosion proof by containment enclosure according to claim 1, wherein the one or more unobstructed openings includes a diameter of between about 0.040-inches (about 1.02-mm) and about 0.096-inches (about 2.44-mm).

7. The low profile explosion proof by containment enclosure according to claim 6, wherein the one or more unobstructed openings includes a diameter of about 0.060-inches (about 1.52-mm).

8. The low profile explosion proof by containment enclosure according to claim 1, wherein the one or more unobstructed openings includes a length of between about 0.125-inches (about 3.18 mm) and about 1.0-inches (about 25.4-mm).

9. The low profile explosion proof by containment enclosure according to claim 8, wherein the one or more unobstructed openings includes a length of about 0.815-inches (about 20.7-mm).

10. The low profile explosion proof by containment enclosure according to claim 1, further comprising: a plurality of fastener receiver members extending substantially perpendicularly outward from the base member, each of the plurality of fastener receiver members including a central passage.

11. The low profile explosion proof by containment enclosure according to claim 10, further comprising: a plurality of fastener openings formed in the cover, each of the plurality of fastener openings being registered with a corresponding one of the plurality of fastener receiver members.

12. The low profile explosion proof by containment enclosure according to claim 11, wherein the central passage of each of the plurality of fastener receiver members includes a plurality of threads.

13. The low profile explosion proof by containment enclosure according to claim 12, further comprising: a plurality of mechanical fasteners extending through corresponding ones of the plurality of fastener openings and threadably engaging with the plurality of threads in each of the plurality of fastener receiver members.

14. A method of relieving pressure in a low profile explosion by containment enclosure having first and second, and third and fourth opposing side walls, the method including:
   allowing air to pass through at least two unobstructed openings formed in one or more of the first and second, and third and fourth opposing side walls, the openings having an aspect ratio and being disposed so as to prevent all flames that may exist in an interior portion of the low profile explosion proof by containment enclosure from passing to an exterior of the low profile explosion proof by containment enclosure.

15. The method of claim 14, further comprising:
   passing fluid through the at least two unobstructed openings from the interior portion of the low profile explosion proof by containment enclosure.

* * * * *